United States Patent [19]

Sobue

[11] Patent Number: 5,559,741
[45] Date of Patent: Sep. 24, 1996

[54] SEMICONDUCTOR MEMORY DEVICE

[75] Inventor: Isaya Sobue, Kasugai, Japan

[73] Assignees: Fujitsu Limited, Kawasaki; Fujitsu VLSI Limited, Kasugai, both of Japan

[21] Appl. No.: 366,729

[22] Filed: Dec. 30, 1994

[30] Foreign Application Priority Data

Jan. 31, 1994 [JP] Japan .................................. 6-009992

[51] Int. Cl.$^6$ .............................. G11C 7/00; G11C 29/00
[52] U.S. Cl. ...................... 365/200; 365/201; 365/230.06
[58] Field of Search ..................................... 365/200, 201, 365/230.06; 371/10.1, 10.2

[56] References Cited

U.S. PATENT DOCUMENTS 4,592,024  5/1986  Sakai et al. ............................... 365/200
4,866,676  9/1989  Crisp et al. ............................... 365/200
5,091,884  2/1992  Kagami .................................... 365/200

*Primary Examiner*—Joseph A. Popek
*Attorney, Agent, or Firm*—Nikaido, Marmelstein, Murray & Oram LLP

[57] ABSTRACT

In a semiconductor memory device with redundant configuration, a redundant address detection circuit is additionally provided between an I/O buffer and a read/write circuit coupled to a memory cell array. The detection circuit receives both a signal indicating the detection of redundancy from a redundant address setter and a signal instructing a test mode for the memory device, and selectively inverts the logic of data associated with the redundant cell. When the data is supplied to memory cells through the redundant address detection circuit under test mode conditions, only data involved in a redundant address is inverted in logic and is written into a redundant cell. Subsequently, a tester reads out the write data of all memory cells to produce a bit map indicating the address of the inverted data and allowing the tester to detect the address of redundant memory cells.

7 Claims, 5 Drawing Sheets

SEMICONDUCTOR MEMORY DEVICE

BACKGROUND OF THE INVENTION

1. Field of the Invention

This invention generally relates to semiconductor memory devices and in particular to redundant memory cells used to maintain semiconductor memory cell operation despite the occurrence of defects in the semiconductor.

2. Description of the Related Art

In general, to access the magnitude of reliability degradation in semiconductor memory devices caused by, for example, manufacturing or assembly errors, factory screening is normally performed to determine the device's effectiveness or ability to perform its function. If a defective cell is found during screening operations, the defective cell is blinded, and a redundant cell provided in the semiconductor memory is used instead of the defective cell. In particular, data access to the cell determined to be defective is switched to that of the redundant cell in order to maintain device operability.

The process by which data access is switched from the defective to redundant cell is performed by disconnecting redundant fuses in a redundant circuit incorporated on the semiconductor chip. When the memory device receives an address signal to select a defective cell, the redundant cell is selected in place of the defective cell in response to the address signal. After the remedial process of replacing the defective cell with the redundant cell as described above, semiconductor memory chips are subjected to a packaging process.

Unfortunately, even after these redundancy detection and switching operations, some semiconductor memory devices are subject to device degradation. Oftentimes, therefore, semiconductor memory device manufacturers generally undertake an analysis as to whether the defective operation of the device is caused by the replaced redundant cell or by circuit elements other than the redundant cell. To do this, the address of the redundant cell i.e., the address of the defective cell, must be known. In order to enable the detection of the redundant cell address, conventional semiconductor memory chips utilize a signature circuit formed on the semiconductor chip.

FIG. 1 shows one example of a signature circuit used in a conventional semiconductor memory device. The signature circuit 1 includes an address signal comparator 2. The address signal comparator 2 receives address signals $A_0$ to $A_n$ from an external unit such as a CPU or the like, as well as redundant address signals $AJ_O$ to $AJ_n$ from a redundant address setter (not shown). The address signal comparator 2 compares the addresses $A_O$ to $A_n$ with the redundant addresses $AJ_O$ to $AJ_n$, and outputs a high level signal when the compared addresses coincide with each other. The output signal of the address signal comparator 2 is input via a first N-channel MOS transistor Tr1 to the gate of a second N-channel MOS transistor Tr2. The first transistor Tr1 has a gate connected to a power source Vcc, allowing the transistor Tr1 to be maintained on at all times. The second transistor Tr2 has a source connected to the power source Vcc and a drain connected to a measuring terminal 3 via two N-channel MOS transistors Tr3 and Tr4. Each of the third and fourth transistors Tr3 and Tr4 has a gate connected to the measuring terminal 3. A capacitor C is provided between the gate of the second transistor Tr2 and the measuring terminal 3. The measuring terminal 3 is connected to a tester 7 to check the operation of a memory device.

The operation of the signature circuit 1 will now be described. The measuring terminal 3 is supplied with a measuring voltage VE from the tester 7 every time the address signals $A_0$ to $A_n$ and the redundant address signals $AJ_O$ to $AJ_n$ are input to the address signal comparator 2. The measuring voltage VE is set higher than Vcc plus 3 $V_{th}$, where "$V_{th}$" is the threshold value of each of the transistors Tr2 to tr4. If the address signals $A_O$ to $A_n$ do not coincide with the redundant address signals $AJ_O$ to $AJ_n$, the address signal comparator 2 outputs a low level signal, setting the gate potential of the transistor Tr2 low and turning the transistor Tr2 off. When the measuring voltage VE is applied to the measuring terminal 3, the transistors Tr3 and Tr4 turn on. However, the transistor Tr2 is kept off, so that no current flows from the tester 7 to the measuring terminal 3.

When the address signals $A_O$ to $A_n$ coincide with the redundant address signals $AJ_O$ to $AJ_n$, the address signal comparator 2 outputs an high level signal. At this time, the gate of the transistor Tr2 goes high, however, the transistor Tr2 is still kept off. The capacitor C is charged by the current originated from the high level comparator signal, allowing the gate potential of the transistor Tr2 to be pulled high. In this situation, when the measuring voltage VE is applied to the measuring terminal 3, the transistors Tr3 and Tr4 turn on. The potential level of the terminal 3 increases up to the measuring voltage VE. As a result, the gate potential of the transistor Tr2 is also raised by a voltage corresponding to measuring voltage VE, and thus becomes higher than the potential level of the power source Vcc. Consequently, the transistor Tr2 is turned on, and current flows from the tester 7 to the power source Vcc through the three transistors Tr4, Tr3 and Tr2. Accordingly, the tester 7 can recognize the coincidence of the input address with the redundant address by detecting the current flowing from the tester 7 into the signature circuit 1.

According to the redundant address detection using the signature circuit as described above, however, the tester 7 is required to increase the potential of the measuring terminal 3 from a low potential level such as a ground level to the measuring voltage VE every time a group of address signals $A_0$ to $A_n$ is input to the address signal comparator 2. This requires a long testing time to search for the redundant address from a large number of addresses, and consequently results in an increase in testing costs.

In the conventional method, the redundant address is determined by detecting the leakage current from the tester 7 through the signature circuit 1 to the power source Vcc. However, such leakage current is liable to be affected by fluctuation of the measuring voltage VE or by signature circuit transistor dispersion. This reduces the reliability of redundant address detection.

SUMMARY OF THE INVENTION

Accordingly, it is a primary object of the present invention to provide a semiconductor memory device having a redundant address detection circuit that can quickly and accurately detect a redundant address, i.e., an address which is substituted for the defective memory cell address.

In order to achieve the foregoing and other objects and in accordance with the purpose of the present invention, an improved semiconductor memory device is provided, which executes data reading and writing operations in accordance with an address signal provided to the memory device.

The semiconductor memory device according to the present invention comprises a memory cell array, a decoder, a read/write circuit, an input/output buffer and a redundant address setter. The memory cell array contains a plurality of memory cells, a part of which is allocated as one or more redundant memory cells. The decoder selects a specific memory cell in the memory cell array in response to the address signal. The read/write circuit performs data reading from the selected cell and/or data writing to the selected cell. The input/output buffer is coupled to the read/write circuit, and controls data input and output for the data written to and read from the memory cell. The redundant address setter is responsive to the defective memory cell address signal, and outputs a signal indicative of the detection of redundancy to switch data access from the defective cell to the redundant cell. The semiconductor memory device further comprises a redundant address detection circuit provided between the read/write circuit and the input/output buffer. The detection circuit receives the redundancy detection signal and a test mode instruction signal for the memory device. Next, the detection circuit selectively inverts the logic of the data associated with the redundant cell in accordance with the redundant detection signal and the test mode instruction signal.

BRIEF DESCRIPTION OF THE DRAWINGS

The features of the present invention that are believed to be novel are set forth with particularly in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 1:
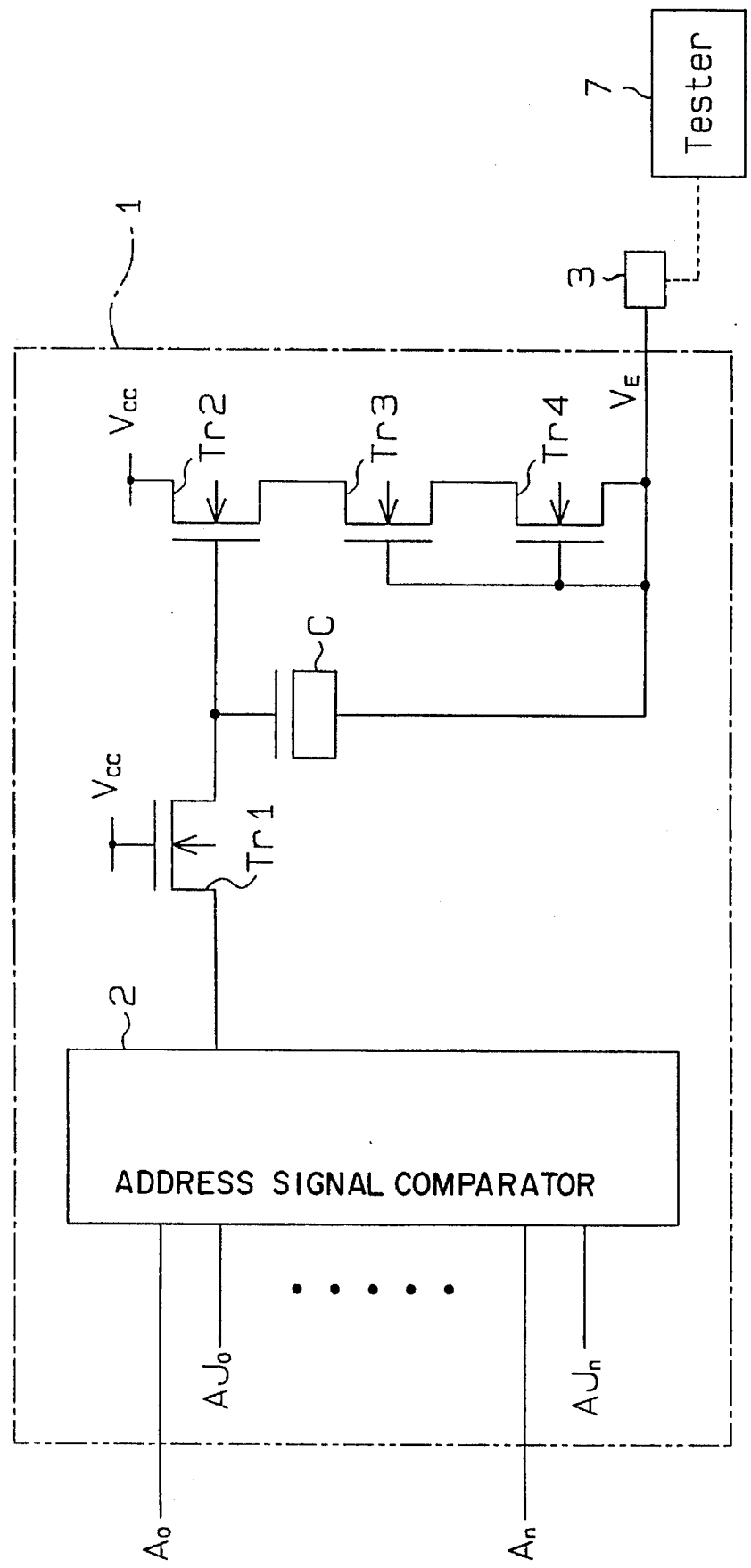
FIG. 1 is a circuit diagram showing a signature circuit installed in a conventional semiconductor memory device.
Figure 2:
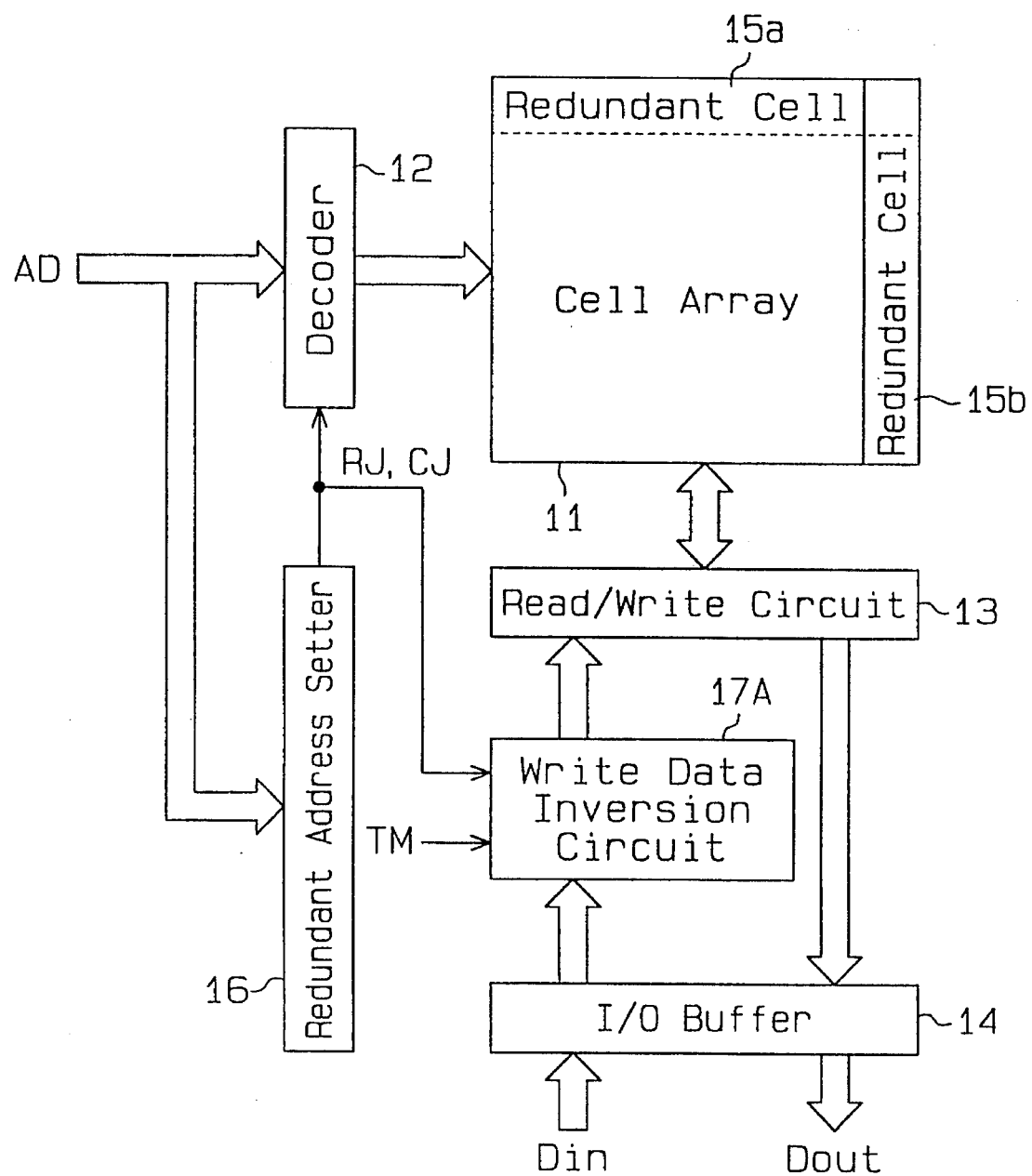
FIG. 2 is a block diagram showing a semiconductor memory device according to a first embodiment of the present invention.

FIG. 2 shows a semiconductor memory device according to a first embodiment of the present invention. The semiconductor memory device includes a memory cell array 11, a decoder 12, a read/write circuit 13, an input/output buffer 14, a redundant address setter 16 and a write data inversion circuit 17A. An address signal AD externally supplied by a CPU or the like is input to the redundant address setter 16 and the decoder 12, which includes a row decoder and a column decoder (not shown). The decoder 12 outputs a control signal to the memory cell array 11. The memory cell array has a large number of memory cells (not shown), a plurality of row-side redundant cells 15a and column-side redundant cells 15b adjacent to the memory cell area.

The redundant address setter 16 has electrically-disconnectable fuses that allows data access to be switched from the defective cells to the redundant cells following cell checking. Fuse disconnection is performed by supplying a high voltage signal to an external terminal of the semiconductor device connected to the redundant address setter 16.

When an address AD input to the redundant address setter 16 is coincident with a redundant address registered in the redundant address setter 16, the redundant address setter 16 outputs to the decoder 12 one of a row-side redundant signal RJ and a column-side redundant signal CJ, which indicates a row-side redundant cell 15a and a column-side redundant cell 15b, respectively. If neither the signal RJ nor the signal CJ are input to the decoder 12, the decoder 12 selects a specific memory cell from the memory cells in the memory cell array 11 on the basis of the address signal AD. On the other hand, if either the signal RJ or the signal CJ is input to the decoder 12, the decoder 12 selects the row-side redundant cell 15a or the column-side redundant cell 15b irrespective of the address AD.

The memory cell array 11 is connected to the read/write circuit 13. The read/write circuit 13 is directly connected to the input/output buffer 14, and also connected to the input/output buffer 14 through the write data inversion circuit 17A, which functions as a redundant address detection circuit. The write data inversion circuit 17A receives the redundant signals RJ and CJ from the redundant address setter 16. When a test mode for detecting the address of the redundant cell is set, the write data inversion circuit 17A receives an active test mode signal TM from an external tester (not shown). On the other hand, in normal modes other than the test mode, the test mode signal is set to be inactive.

When a data write operation is carried out for the memory cell array 11, write data Din is input to the input/output buffer 14 from an external equipment (not shown). The input write data Din is transmitted to the memory cell array 11 through the write data inversion circuit 17A and the read/write circuit 13, and is written into the selected memory cell or redundant cell. When a data read operation is carried out for the memory cell array 11, read data from the selected memory cell or redundant cell is output as read data Dout through the read/write circuit 13 from the input/output buffer 14.

Figure 3:
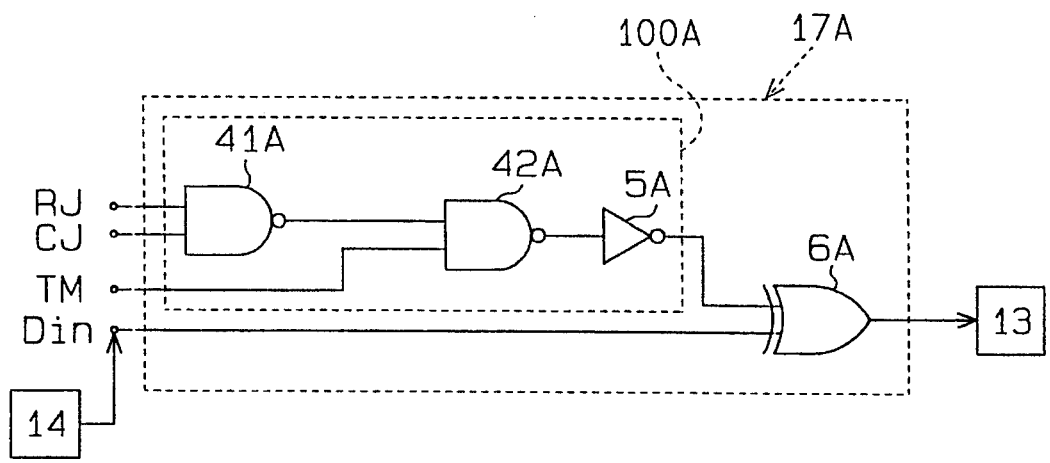
FIG. 3 is a logic diagram illustrating a write data inversion circuit of the first embodiment.

FIG. 3 shows the detailed construction of the write data inversion circuit 17A. The inversion circuit 17A includes two NAND gates 41A and 42A, an inverter 5A, an exclusive OR (EOR) gate 6A. The first NAND gate 41A receives the row-side redundant signal RJ and the column-side redundant signal CJ. The level of each of the redundant signals RJ and CJ is set to a low level when a redundant address is selected. Conversely, each are set to a high level when no redundant address is selected. The second NAND gate 42A is supplied with an output signal of the first NAND gate 41A and the test mode signal TM. The test mode signal TM is set to a high level in the test mode, and set to a low level when the write data inversion circuit is in mode other than the test mode. The output signal of the second NAND gate 42A is input to the EOR gate 6A via the inverter 5A. The EOR gate 6A is also supplied with the write data Din from the input/output buffer 14. The EOR circuit 6A outputs data signals to the read/write circuit 13. The NAND gates 41A and 42A and the inverter 5A form a redundancy detection circuit 100A for detecting the selection of the redundant address when the test mode.

The operation of the write data inversion circuit 17A will now be described. The test mode signal TM is set low in the normal modes. Then, the output signal of the second NAND gate 42A is set high irrespective of the redundant signals RJ and CJ, and the output signal of the inverter 5A is set low. In this situation, when low level write data Din is input to the EOR gate 6A, the output signal of the EOR circuit 6A goes low. When high level write data Din is input to the EOR gate 6A, the output signal of the EOR gate 6A goes high. Accordingly, in the normal modes, the write data Din passes through the write data inversion circuit 17A, maintaining its logic level.

In the test mode, the test mode signal TM is set high. Since both of the redundant signals RJ and CJ are set high when redundant address is not selected, the output signal of the first NAND gate 41A goes low. Accordingly, the output signal of the second NAND gate 42A goes high, and the output signal of the inverter 5A goes low. Therefore, in this case, the write data Din passes through the write data inversion circuit 17A, also maintaining its logic level.

When the redundant address is selected in the test mode, one of the redundant signals RJ and CJ goes low. Then, the output signal of the first NAND gate 41A goes high, the output signal of the second NAND gate 42A goes low, and the output signal of the inverter 5A goes high. In this situation, if the write data Din is set high, the output signal of the EOR gate 6A would go low. If the write data Din is set low, the output signal of the EOR gate 6A would go high. In other words, when the redundant address is selected in the test mode, the write data Din is inverted by the write data inversion circuit 17A, so that the inverted data is transmitted to the read/write circuit 13. Accordingly, data obtained by inverting the logic of the write data Din is written into a redundant cell.

According to this embodiment, when the same data (e.g., "1") is supplied to each memory cell in the test mode to detect the redundant address, the inverted data (i.e., "0") is written into only the row-side or column-side redundant cell involved in the redundant address.

Figure 4:
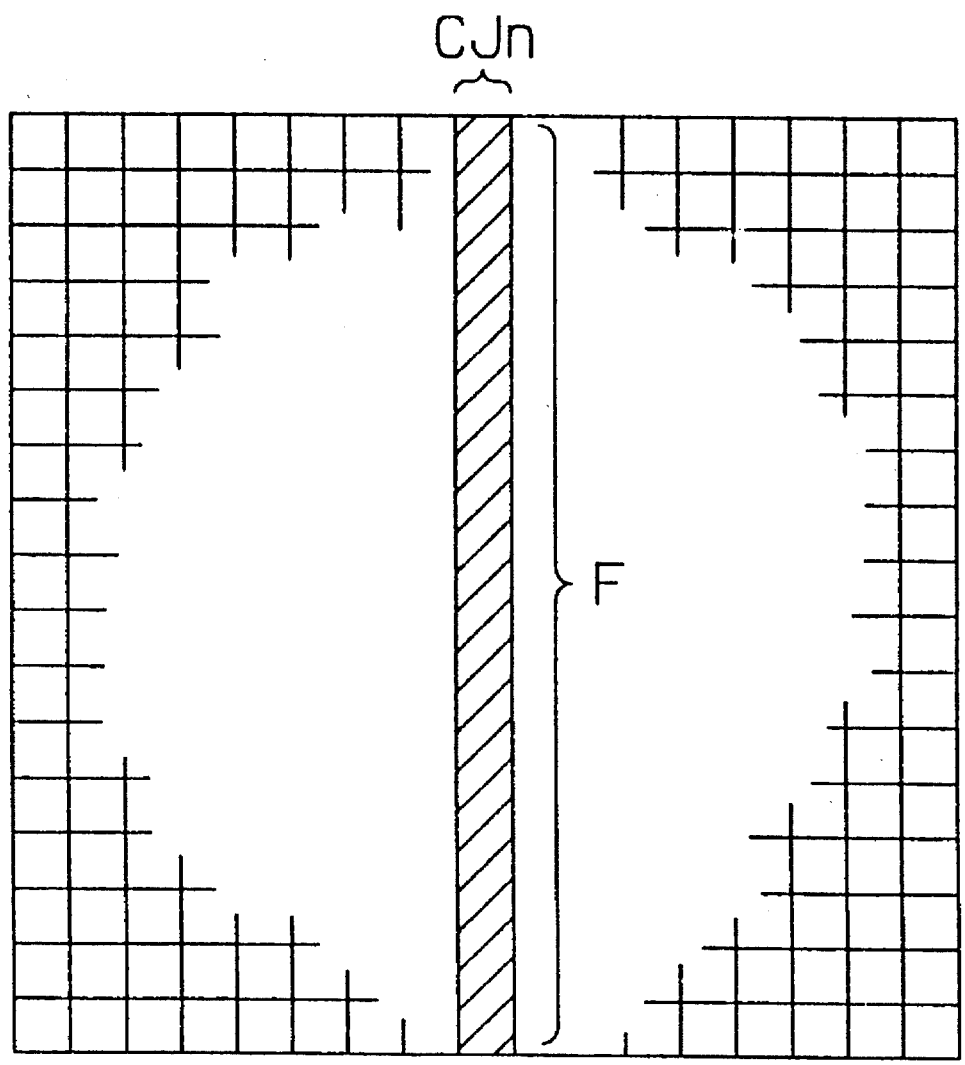
FIG. 4 is a schematic view showing a bit map produced by a tester circuit.

Subsequently, the tester reads data written from all of the memory cells of the semiconductor memory to produce a bit map similar to that illustrated in FIG. 4. For example, when the column-side redundant address CJn is set as shown in FIG. 4, the logic of the data read from the redundant address CJn is inverted with respect to the logic of data read from addresses other than the address CJn. Consequently the bits corresponding the redundant address can be detected as fail bits F. This allows the column-side redundant address to be easily determined based on the address of the fail bits F.

The operation of producing the above bit map can be performed in an extremely shorter time than the detection of the redundant address using the signature circuit as described in the related art section. Further, the use of this type of bit map allows the row-side and column-side redundant addresses to be simultaneously detected. Therefore, according to this embodiment, the redundant address can be detected easily and in a short time. Further, since the redundant address is detected by judging whether the inverted write data is written in the cells, the detection of the redundant address is virtually unaffected by transistor dispersion provided in the write data inversion circuit 17A, so that the redundant address can be more accurately detected.

Figure 6:
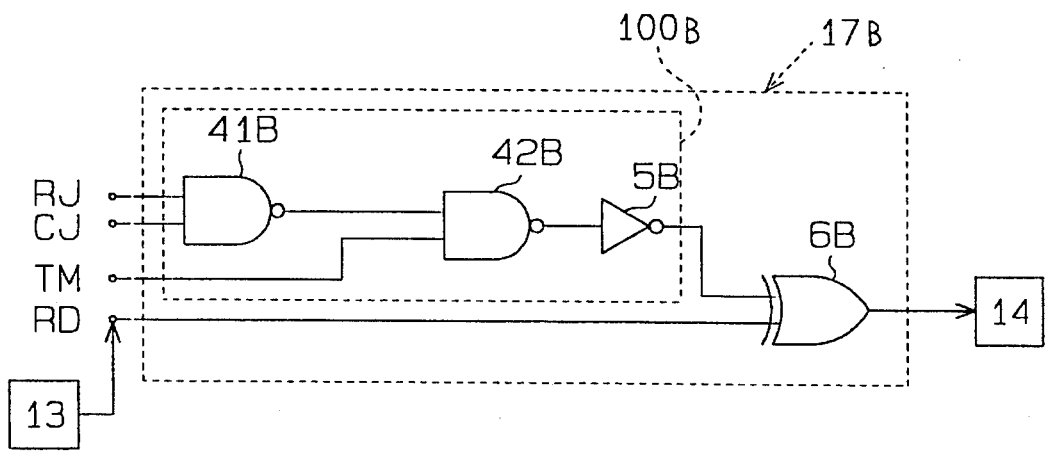
FIG. 6 is a circuit diagram showing a read data inversion circuit of the second embodiment.
Figure 5:
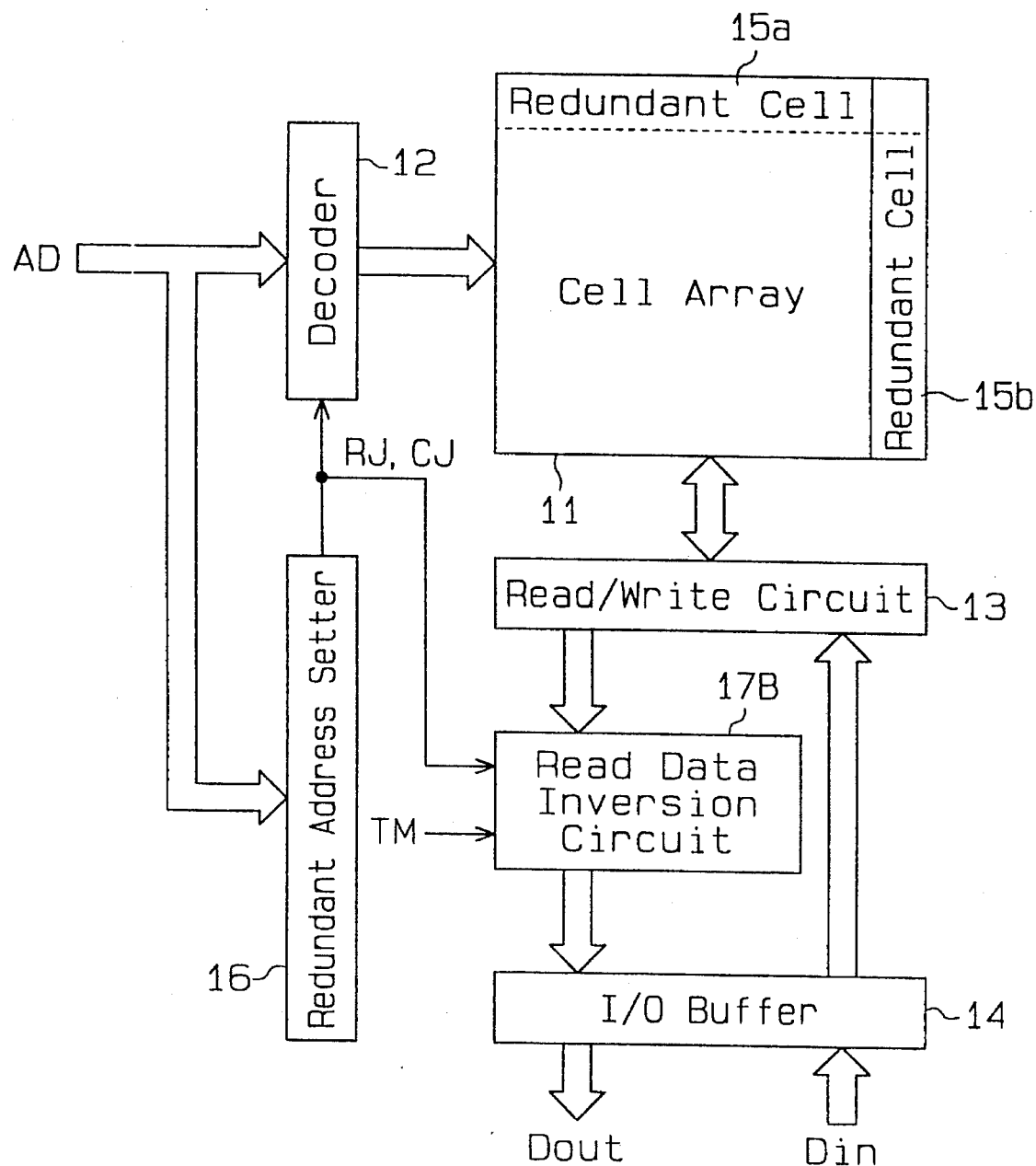
FIG. 5 is a block diagram showing a semiconductor memory device according to a second embodiment of the present invention.

FIGS. 5 and 6 show a semiconductor memory device according to a second embodiment of the present invention. The second embodiment is substantially identical to the first embodiment except that the write data inversion circuit 17A of the first embodiment is replaced with a read data inversion circuit 17B. That is, as shown in FIG. 5, read data from the read/write circuit 13 is transmitted through a read data inversion circuit 17B to the input/output buffer 14, and is output as read data Dout from the input/output buffer 14. Write data Din input to the input/output buffer 14 is transmitted to the read/write circuit 13. The read data inversion circuit 17B receives the redundant signals RJ and CJ from the redundant address setter 16 and the test mode signal TM from the tester (not shown).

As shown in FIG. 6, the read data inversion circuit 17B includes two NAND gates 41B and 42B, an inverter 5B and an EOR gate 6B, like the write data inversion circuit 17A of the first embodiment. The gates 41B and 42B and the inverter 5B forms a redundancy detection circuit 100B. However, the EOR gate 6B receives the read data RD from the read/write circuit 13, and supplies its output signal to the input/output buffer 14.

According to this embodiment, only when a redundant address is selected in the test mode, the read data inversion circuit 17B inverts the read data RD from the read/write circuit 13 to supply the inverted data to the input/output buffer 14. Accordingly, if the same data is supplied to all the memory cells and the data stored in the cells are read out therefrom, only the read data from the redundant cell involved in the redundant address are inverted by the inversion circuit 17B. As a result, the tester can easily detect the redundant address based on the inverted read data, in a short period of time.

As in the first embodiment, detection of the redundant address is virtually unaffected by transistor dispersion in the read data inversion circuit 17B. Consequently, the redundant address can be more accurately detected.

Although only two embodiments of the present invention have been described herein, it should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope of the appended claims.

What is claimed is:

1. A semiconductor memory device having a plurality of memory cells forming a memory cell array and at least one redundant memory cell, wherein when a memory cell is determined to be defective, the address location of a redundant memory cell is set as the address location of the defective memory cell, said semiconductor memory device comprising:

a decoder coupled to said memory cell array and responsive to an address signal, for selecting a specific memory cell in said cell array;

a read/write circuit communicatively coupled to said cell array, for performing one of a reading and a writing operation with respect to said selected cell;

a data buffer communicatively coupled to said read/write circuit, for buffering the flow of data associated with said read/write circuit during one of a read mode, a write mode, and a test mode;

a redundant address setter communicatively coupled to said decoder and responsive to the address signal, for setting the address location of a redundant memory cell to that of a memory cell determined to be defective and for outputting a redundant setting signal; and a data logic control circuit, communicatively coupled to said read/write circuit and to said data buffer, for inverting the logic of data associated with the redundant memory cell in response to a memory device test mode signal and said redundant setting signal in the test mode, and for allowing the data associated with the selected cell to pass therethrough in the read mode and the write mode.

2. The semiconductor memory device according to claim 1, wherein said data logic control circuit includes a write data inversion circuit for selectively inverting write data in accordance with the redundant setting signal and the test mode signal, and for outputting the inverted data to said read/write circuit.

3. A semiconductor memory device having a plurality of memory cells forming a memory cell array and at least one redundant memory cell, wherein when a memory cell is determined to be defective, the address location of a redundant memory cell is set as the address location of the defective memory cell, said semiconductor memory device comprising:

a decoder coupled to said memory cell array and responsive to an address signal, for selecting a specific memory cell in said cell array;

a read/write circuit communicatively coupled to said cell array, for performing one of a reading and a writing operation with respect to said selected cell;

a data buffer communicatively coupled to said read/write circuit, for buffering the flow of data associated with said read/write circuit:

a redundant address setter communicatively coupled to said decoder and responsive to the address signal, for setting the address location of a redundant memory cell to that of a memory cell determined to be defective and for outputting a redundant memory cell address signal; and a redundant address detection circuit, communicatively coupled to said read/write circuit and to said data buffer, and responsive to a memory device test mode signal and to said redundant memory cell address signal, for inverting the logic of data associated with the redundant memory cell, wherein said redundant address detection circuit includes a write data inversion circuit for selectively inverting write data in accordance with the redundant memory cell address signal and the test mode signal, and for outputting the inverted data to said read/write circuit; wherein said write data inversion circuit includes a redundancy detection circuit for receiving the redundant memory cell address signal and the test mode signal and for outputting a high level signal when a redundant address is selected under the test mode; and an exclusive OR (EOR) gate responsive to the output from said redundancy detectin circuit and to the write data from said data buffer.

4. The semiconductor memory device according to claim 3, wherein said redundancy detection circuit includes:

a first NAND gate responsive to the output from said redundant address setter;

a second NAND gate responsive to the output from said first NAND gate and to said test mode signal; and a inverter responsive to the output from said second NAND gate, for outputting a signal to said exclusive OR (EOR) gate.

5. The semiconductor memory device according to claim 1, wherein said data logic control circuit includes a read data inversion circuit for inverting read data in accordance with the redundant setting signal and the test mode signal, and for outputting the inverted data to said data buffer.

6. A semiconductor memory device having a plurality of memory cells forming a memory cell array and at least one redundant memory cell, wherein when a memory cell is determined to be defective, the address location of a redundant memory cell is set as the address location of the defective memory cell, said semiconductor memory device comprising:

a decoder coupled to said memory cell array and responsive to an address signal, for selecting a specific memory cell in said cell array;

a read/write circuit communicatively coupled to said cell array, for performing one of a reading and a writing operation with respect to said selected cell;

a data buffer communicatively coupled to said read/write circuit, for buffering the flow of data associated with said read/write circuit;

a redundant address setter communicatively coupled to said decoder and responsive to the address signal, for setting the address location of a redundant memory cell to that of a memory cell determined to be defective and for outputting a redundant memory cell address signal; and redundant address detection circuit, communicatively coupled to said read/write circuit and to said data buffer, and responsive to a memory device test mode signal and to said redundant memory cell address signal, for inverting the logic of data associated with the redundant memory cell, wherein said redundant address detection circuit includes a read data inversion circuit for inverting read data in accordance with the redundant memory cell address signal and the test mode signal, and for outputting the inverted data to said data buffer; wherein said read data inversion circuit includes a redundancy detection circuit for receiving the redundant memory cell address signal and the test mode signal and for outputting a high level signal when a redundant cell address is selected under the test mode; and an exclusive OR (EOR) gate responsive to the output from said redundancy detection circuit and to the read data from said read/write circuit.

7. The semiconductor memory device according to claim 6, wherein said redundancy detection circuit includes:

a first NAND gate responsive to the output from said redundant address setter;

a second NAND gate responsive to the output from said first NAND gate and to said test mode signal; and a inverter responsive to the output from said second NAND gate, for outputting a signal to said exclusive OR (EOR) gate.

* * * * *